United States Patent [19]

Forth et al.

[11] Patent Number: 4,764,923
[45] Date of Patent: Aug. 16, 1988

[54] DIGITAL RECEIVE FILTER CIRCUIT

[75] Inventors: Leslie Forth; Raymond S. Duley, both of Austin, Tex.

[73] Assignee: Advance Micro Devices, Inc., Sunnyvale, Calif.

[21] Appl. No.: 21,291

[22] Filed: Mar. 3, 1987

[51] Int. Cl.[4] .......................................... H03M 13/00
[52] U.S. Cl. ................................................ 371/6; 371/55
[58] Field of Search ....................................... 371/6, 55

[56] References Cited

U.S. PATENT DOCUMENTS

| | | | |
|---|---|---|---|
| 3,386,079 | 5/1968 | Wiggins | 371/6 |
| 3,396,369 | 8/1968 | Brothman et al. | 371/6 |
| 3,449,716 | 6/1969 | Brothman et al. | 371/6 |
| 3,480,910 | 11/1969 | Brenza et al. | 371/6 |
| 3,523,278 | 8/1970 | Hinkel | 371/6 |
| 4,514,854 | 4/1985 | Ashida | 371/6 |
| 4,686,676 | 8/1987 | McPherson | 371/6 |

OTHER PUBLICATIONS

Oeters et al, "Error Detector", *IBM Tech. Disclosure Bulletin*, vol. 6, No. 4, Sep. 1963, pp. 43-44.
Gural, "Code Transition Detector", *IBM Tech. Disclosure Bulletin*, vol. 23, No. 7A, pp. 2875-2876.
Abbiate et al, "Continuous Code Checking in Bipolar Transmission", *IBM Tech. Disclosure Bulletin*, vol. 23, No. 7A, Dec. '80, p. 2849c.

*Primary Examiner*—David H. Malzahn
*Attorney, Agent, or Firm*—Patrick T. King; Davis Chin

[57] ABSTRACT

A digital filter receive circuit for use with a StarLAN coded data transceiver includes three D-type flip-flops and four NAND logic gates. The digital receive line filter circuit is capable of being implemented as part of a single monolithic integrated circuit containing the transceiver, thereby producing a miniaturized and compact structure.

15 Claims, 1 Drawing Sheet

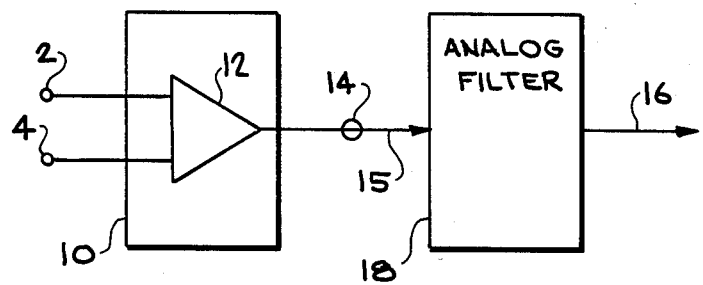
(PRIOR ART) FIG. 1
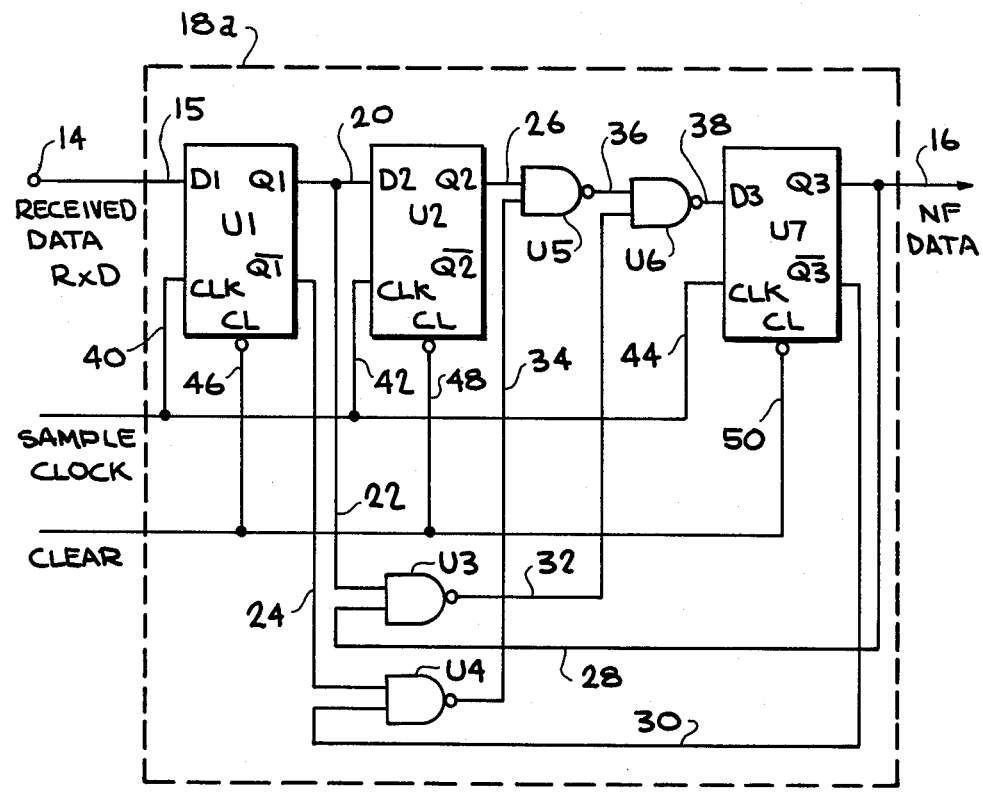
FIG. 2

DIGITAL RECEIVE FILTER CIRCUIT

BACKGROUND OF THE INVENTION

This invention relates generally to digital filter circuitry and more particularly, it relates to a digital receive filter circuit for use with a StarLAN (proposed specification IEEE P802.3-86/0.06G entitled "Physical Signaling, Medium Attachment, and Baseband Medium Specifications, Type 1BASE5") coded data transceiver.

In FIG. 1, there is shown a StarLAN (an acronym for Star Local Area Network) transceiver 10 which includes a receiver 12. The receiver 12 consists of a differential line receiver which is similar to the one that is commercially available from Advanced Micro Devices, Inc. of Sunnyvale, Calif. and designated by their part No. Am26LS32. The line receiver 12 has its inputs coupled to input terminals 2 and 4 for receiving differential input signals and converts the same to a single-ended digital data input signal R×D appearing at its output on terminal 14. Typically, the digital data input signal R×D is a Manchester encoded data transmission signal which is transmitted over a common communication cable defining a receive channel from another transceiver connected to the same cable. It has been encountered, in practice, that this input signal R×D, at the output terminal 14 is quite susceptible to line noise and transients which are passed through from the input terminals 2 and 4 of the line receiver 12.

In order to suppress false signals in the line receiver 12 due to interference from such line noise and transients, there has been attempted in the prior art of providing an analog filter 18 using discrete components which is interconnected between the output terminal of the line receiver 12 and a line 16 which is connected to other parts of the transceiver. While such a prior art analog filter is believed to perform adequately, it does not readily lend itself to miniaturization as required in hitech digital communication networks.

It would therefore be desirable to provide a digital receive filter circuit for generating appropriate filtering to avoid false triggering due to interference at the output of a line receiver. By selection of circuit components and functions, the digital receive filter circuit of the instant invention is capable of being fabricated with a StarLAN coded data transceiver as a part of a single monolithic integrated circuit in a compact and efficient configuration.

SUMMARY OF THE INVENTION

Accordingly, it is a general object of the present invention to provide a digital receive filter circuit which is relatively simple and economical to manufacture and assemble, but yet overcomes the disadvantages of the prior art filter circuits.

It is an object of the present invention to provide a digital receive filter circuit for use with a StarLAN coded data transceiver which includes shift register means having an input node and an output node, clock means connected to the shift register means for sampling of a data input signal to provide a filtered data signal at the output node, and logic means connected to the shift register means for correcting the logic level at a third stage of the shift register means.

It is another object of the present invention to provide a digital receive filter circuit for use with a StarLAN coded data transceiver which is formed of three D-type flip-flops and four NAND logic gates.

It is still another object of the present invention to provide a digital receive filter circuit for use with a StarLAN coded data transceiver which may be formed as a part of a single monolithic integrated circuit.

In accordance with these aims and objectives, the present invention is concerned with the provision of a digital receive filter circuit for use with a StarLAN coded data transceiver which includes first, second and third D-type flip-flops and first, second, third and fourth NAND logic gates. The first D-type flip-flop has a data input, a clock input, and true and complement outputs. The data input of the first flip-flop is connected to an input node for receiving digital data input signals from the output of a line receiver in the transceiver. The second D-type flip-flop has a data input, a clock input and a true output. The data input of the second flip-flop is connected to the true output of this first flip-flop. The third D-type flip-flop has a data input, a clock input, and true and complement outputs. The true output of the third flip-flop is connected to an output node for providing a filtered data signal. The clock inputs of the first, second and third flip-flops are connected to receive a sample clock signal. The first NAND logic gate has first and second inputs and an output. The first logic gate has its first input connected to the true output of the first flip-flop and its second input connected to the true output of the third flip-flop. The second NAND logic gate has first and second inputs and an output. The second logic gate has its first input connected to the complement output of the first flip-flop and its second input connected to the complement output of the third flip-flop. The third NAND logic gate has first and second inputs and an output. The third logic gate has its first input connected to the true output of the second flip-flop and its second input connected to the output of the second logic gate. The fourth NAND logic gate has first and second inputs and an output. The fourth logic gate has its first input connected to the output of the first logic gate, its second input connected to the output of the third logic gate, and its output connected to the data input of the third flip-flop.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a block diagram of the prior art illustrating a transceiver with an analog filter; and FIG. 2 is a detailed logic diagram of the digital receive filter circuit of the present invention for use with a StarLAN coded data transceiver.

DESCRIPTION OF THE PREFERRED EMBODIMENT

It is to be distinctly understood at the outset that the present invention shown in association with a StarLAN coded data transceiver is not intended to serve as a limitation upon the scope or teachings thereof, but is merely for the purpose of convenience of illustration of one example of its application. The present invention has numerous applications in other fields and apparatuses since the invention pertains to a digital filter circuit which eliminates interference caused by line noise and transients.

Referring now to the drawings, there is shown in FIG. 1 in block diagram form a portion of a communication network of the prior art which includes a Star-LAN coded data transceiver 10. The transceiver 10 includes a differential line receiver 12 whose inputs are coupled to input terminals 2 and 4 and whose output is connected to an analog filter 18 via output terminal 14 and a line 15. The analog filter 18 is used to reduce and/or eliminate line noise and transients appearing at the input terminals 2 and 4 of the line receiver 12 in the transceiver 10 from reaching a line 16. The line 16 defines the output of the analog filter 18 and is connectible to other parts of the transceiver. The present invention is concerned with the provision of a digital receive line filer circuit which is used to replace the analog filter 18 of FIG. 1. The digital receive line filter circuit of the instant invention is designed so as to be capable of being implemented as being a part of a single monolithic integrated circuit. In particular, the instant digital filter circuit may be fabricated as a portion of the same integrated circuit containing the transceiver 10, thus producing a miniaturized and compact structure. A detailed logic diagram of the digital filter circuit for use with the StarLAN coded data transceiver 10 (FIG. 1) is illustrated in FIG. 2 of the drawings.

A digital filter circuit 18a of the present invention shown in FIG. 2 is connected between the line 16 and the output of the differential line receiver 12 in the transceiver 10. The output terminal 14 receives a single-ended digital data input signal R×D which has passed through the line receiver 12 via the input terminals 2 and 4. The output of the digital filter circuit 18a is on the line 16 which provides a filtered data input signal for other parts of the receiver. The input signal R×D is typically a Manchester encoded data transmission signal which has been sent over a common communication cable from another transceiver connected to the same cable. The transmitter in the other transceiver is sending the transmission signal which has been generated by a LAN (local area network) controller (not shown) of the type manufactured by Intel Corporation under the designation 82586.

The digital receive filter circuit 18a comprises a low pass filter formed of a three-stage shift register and an interstage network. The shift register is formed of three D-type flip-flops U1, U2 and U7. The interstage network is formed of four two-input NAND logic gates U3, U4, U5 and U6. It should be understood that all of the circuit components U1–U7 are preferably implemented within a single monolithic semiconductor chip or integrated circuit containing the transceiver 10, thereby permitting a compact and efficient configuration.

The flip-flop U1 has its data input D1 connected to the input terminal 14 defining the input of the filter circuit via the line 15. The true output Q1 of the flip-flop U1 is connected to the data input D2 of the flip-flop U2 via the line 20 and to a first input of the NAND logic gate U3 via line 22. The complement output $\overline{Q1}$ of the flip-flop U1 is connected to a first input of the logic gate U4 via line 24. The true output Q2 of the flip-flop U2 is connected to a first input of the logic gate U5 via line 26. The true output Q3 of the flip-flop U7 is connected to the line 16 defining the output of the filter circuit 18a and to a second input of the logic gate U3 via line 28.

The complement output $\overline{Q3}$ of the flip-flop U7 is connected to a second input of the logic gate U4 via line 30. The output of the logic gate $\overline{U3}$ is connected to a first input of the logic gate U6 via line 32. The output of the logic gate U4 is connected to a second input of the logic gate U5 via line 34. The output of the logic gate U5 is connected to a second input of the logic gate U6 via line 36. The output of the logic gate U6 is connected to the data input D3 of the flip-flop U7 via line 38. Each of the flip-flops U1, U2 and U7 has a clock terminal CLK which is connected via respective lines 40, 42 and 44 to a sample clock signal. Each of the flip-flops U1, U2 and U7 also has a clear terminal CL which is connected via respective lines 46, 48 and 50 to a clear signal. The clear signal is used to reset the shift register prior to each data transmission.

For StarLAN applications, the maximum rate of data transmission is approximately 1 MHz. Since the ratio of the frequency of the data input signal to the frequency of the sample clock signal determines the effectiveness of the filter circuit 18a, the minimum ratio should be selected so as to insure that at least three samples are made of each data level in each bit cell of the data input signal. The maximum ratio is determined by the likely duration of the high-frequency noise pulses appearing at the input terminals 2 and 4 of the receiver 12 since it is required that such noise pulses be less than two sampling clock periods. As a result, the frequency of the sample clock signal has been chosen to be approximately 16 MHz which produces a ratio of 1:16 and sets an upper limit of 125 ns as the maximum duration of the noise pulses which may be corrected. Other frequencies may be used at times according to the nature of the noise pulses.

In operation, the digital filter circuit 18a is used to correct the digital data input signal R×D in the presence of noise. The data level of the input signal will be either at a high or logic "1" level or at a low or logic "0" level. When the data level is at the logic "0" level, the noise will cause the data signal to make a first transition to the logic "1" level. The data level of the input signal will make a second or subsequent transition back to the logic "0" level after the noise disappears. Similarly, when the data level is at the logic "1" level the noise will cause the data signal to make a first transition to the logic "0" level. The data level of the input signal will make a second or subsequent transition back to the logic "1" level after the noise disappears. The data level of the input signal is sampled by three successive clock signals to determine if two such successive changes or transitions have occurred. If this condition exists, the filter circuit 18a will correct the filtered output signal on the line 16 so as to eliminate the false transition due to this noise.

Initially, the clear signal will reset the true outputs of the flip-flops U1, U2 and U7 to the logic "0" state (Q1=0; Q2=0; and Q3=0) prior to the start of receiving of the data input signal R×D. Under normal conditions, in the absence of noise and assuming that the data level is at the logic "1" state, each of the three successive samples will be at the logic "1" state. It will be noted that it takes three samples in order to shift the data level at the input terminal 14 to the output on the line 16. Therefore, when a logic "1" data level is being transmitted the true outputs of the shift register will be at 111 (Q1=1; Q2=1; and Q3=1) after three successive samples.

However, when the logic "1" data level is being transmitted and high-frequency noise causes the sampling of a logic "0" at the input terminal 14 rather than the normal logic "1" data level, the true outputs of the shift register will be at 101 after two successive samples. This indicates that a false transition of data level has occurred since there has been two successive transitions, i.e., a first transition from a logic "1" to a logic "0" and a second transition from the logic "0" back to the logic "1", which should never occur. With these circumstances, the output of the logic gate U3 on the line 32 will be at the logic "0" and the outputs of the logic gates U4, U5 on the respective lines 34, 36 will be at the logic "1". Thus, the output of the logic gate U6 on the line 38 will be at the logic "1". As a result, on the next successive sample the true output (Q2=0) of the flip-flop U2 will not be shifted to the output on the line 16 but rather be corrected to the normal logic "1" data level since this is what should have been sampled.

Similarly, under normal conditions in the absence of noise and with a logic "0" data level being transmitted, the true outputs of the shift register will be at 000 (Q1=1; Q2=0; and Q3=0) after three successive samples. However, when the logic "0" data level is being transmitted and high-frequency noise causes the sampling of a logic "1" at the input terminal 14 rather than the normal logic "0" data level, the true outputs of the shift register will be at 010 after two successive samples. This again indicates a false transition due to the two successive transitions, i.e., a first transition from a logic "0" to a logic "1" and a second transition from the logic "1" back to the logic "0" which should not occur. Under these circumstances, the output of the logic gate U3 will be at the logic "1"; the output of the logic gate U4 will be at the logic "0"; and the output of the logic gate U5 will be at the logic "1". Thus, the output of the logic gate U6 will be at the logic "0". As a result, on the next successive sample the true output (Q2=1) of the flip-flop U2 will again not be shifted to the output on the line 16 but rather will be corrected to the normal logic "0" data level since this is what should have been sampled but for the interference from the noise.

It should be appreciated that only when the true outputs of the shift register is at 101 or 010 is the output Q3 on the line 16 corrected on the next successive sample. In other words, the logic level of the true output Q3 is corrected upon the next sampling to be the same logic level as the previous logic levels of the true outputs Q1 and Q3 only when the previous logic level of the true output Q2 is different from both the previous logic levels of the true outputs Q1 and Q3. It will be noted for the remaining possible conditions of the true outputs of the shift register, i.e., 001; 011; 100; and 110, there exists only one change in the data levels either from the logic "1" to the logic "0" or the logic "0" to the logic "1". This constitutes a legitimate transition in the data level being transmitted and thus no correction is required.

From the foregoing detailed description, it can thus be seen that the present invention provides a digital receive filter circuit which is formed of three D-type flip-flops and four NAND logic gates. Further, the digital filter of the present invention is capable of being fabricated with a StarLAN coded data transceiver as part of a single monolithic integrated circuit.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A digital receive filter circuit for use with a Star-LAN coded data transceiver, comprising:
    a first D-type flip-flop having a data input, a clock input, and true and complement outputs, said data input of said first flip-flop being connected to an input node for receiving digital data input signals from the output of a line receiver in the transceiver;
    a second D-type flip-flop having a data input, a clock input, and a true output, said data input on said second flip-flop being connected to the true output of said first flip-flop;
    a third D-type flip-flop having a data input, a clock input, and true and complement outputs, said true output of said third flip-flop being connected to an output node for providing a filtered data signal;
    the clock inputs of said first, second and third flip-flops being connected to receive a sample clock signal;
    a first NAND logic gate having first and second inputs and an output, said first logic gate having its first input connected to the true output of said first flip-flop and its second input connected to the true output of said third flip-flop;
    a second NAND logic gate having first and second inputs and an output, said second logic gate having its first input connected to the complement output of said first flip-flop and its second input connected to the complement output of said third flip-flop;
    a third NAND logic gate having first and second inputs and an output, said third logic gate having its first input connected to the true output of said second flip-flop and its second input connected to the output of said second logic gate; and
    a fourth NAND logic gate having first and second inputs and an output, said fourth logic gate having its first input connected to the output of said first logic gate, its second input connected to the output of said third logic gate, and its output connected to the data input of said third flip-flop.

2. A digital receive filter circuit as claimed in claim 1, wherein each of said first, second and third flip-flops has a clear terminal which is connected to a clear signal for resetting the respective true outputs to a low logic level prior to the receipt of the digital data input signals.

3. A digital receive filter circuit as claimed in claim 1, wherein the minimum ratio of the frequency of the digital data input signals relative to the frequency of the sample clock signals is such that at least three samples are made for each data level of the digital data input signals.

4. A digital receive filter circuit as claimed in claim 3, wherein the frequency of the digital data input signals is approximately 1 MHz and the frequency of the sample clock signal is approximately 16 MHz.

5. A digital receive filter circuit as claimed in claim 1, wherein said filter circuit is formed as a part of a single monolithic integrated circuit.

6. A digital receive filter circuit for use with a Star-LAN coded data transceiver, comprising:
- first flip-flop means having a data input, a clock input, and true and complement outputs, said data input of said first flip-flop means being connected to an input node for receiving digital data input signals from the output of a line receiver in the transceiver;
- second flip-flop means having a data input, a clock input, and a true output, said data input on said second flip-flop means being connected to the true output of said first flip-flop means;
- third flip-flop means having a data input, a clock input, and true and complement outputs, said true output of said third flip-flop means being connected to an output node for providing a filtered data signal;
- the clock inputs of said first, second and third flip-flop means being connected to receive a sample clock signal;
- first logic means having first and second inputs and an output, said first logic means having its first input connected to the true output of said first flip-flop means and its second input connected to the true output of said third flip-flop means;
- second logic means having first and second inputs and an output, said second logic means having its first input connected to the complement output of said first flip-flop means and its second input connected to the complement output of said third flip-flop means;
- third logic means having first and second inputs and an output, said third logic means having its first input connected to the true output of said second flip-flop means and its second input connected to the output of said third logic means; and
- fourth logic means having first and second inputs and an output, said fourth logic means having its first input connected to the output of said first logic means, its second input connected to the output of said third logic means, and its output connected to the data input of said third flip-flop means.

7. A digital receive filter circuit as claimed in claim 6, wherein each of said first, second and third flip-flop means comprises a D-type flip-flop.

8. A digital receive filter circuit as claimed in claim 7, wherein each of said first, second, third and fourth logic means comprises a NAND logic gate.

9. A digital receive filter circuit as claimed in claim 7, wherein each of said first, second and third flip-flops have a clear terminal which is connected to a clear signal for resetting the respective true outputs to a low logic level prior to the receipt of the digital data input signals.

10. A digital receive filter circuit as claimed in claim 6, wherein the minimum ratio of the frequency of the digital data input signals relative to the frequency of the sample clock signals is such that at least three samples are made for each data level of the digital data input signals.

11. A digital receive filter circuit as claimed in claim 10, wherein the frequency of the digital data input signals is approximately 1 MHz and the frequency of the sample clock signal is approximately 16 MHz.

12. A digital receive filter circuit as claimed in claim 6, wherein said filter circuit is formed as a part of a single monolithic integrated circuit.

13. A digital filter circuit comprising:
- shift register means having an input node and an output node and being formed of first, second and third stages for receiving digital data input signals at the input node, each of said first, second and third stages having a high or low logic state;
- clock means connected to said shift register means for sampling of said data input signals to provide a filtered data signal at the output node; and
- logic and gate means connected to said shift register means for correcting the logic state of said third stage upon the next sampling to be at the same logic state as the previous logic state of the first and third stages only when the logic state of the previous second stage is different from both the previous logic states of the first and third stages.

14. A digital filter circuit as claimed in claim 13, wherein each of said first, second and third stages of said shift register means comprises a D-type flip-flop.

15. A digital filter circuit as claimed in claim 14, wherein said logic and gate means comprises four NAND logic gates.

* * * * *